United States Patent
Wiser et al.

(10) Patent No.: US 11,693,056 B1
(45) Date of Patent: Jul. 4, 2023

(54) SCAN CHAIN FOR MEMORY WITH REDUCED POWER CONSUMPTION

(71) Applicant: Ceremorphic, Inc., San Jose, CA (US)

(72) Inventors: Robert F. Wiser, Santa Cruz, CA (US); Shakti Singh, Bijnor Uttar Pradesh (IN); Neelam Surana, Palaj (IN)

(73) Assignee: Ceremorphic, Inc., San Jose, CA (US)

( * ) Notice: Subject to any disclaimer, the term of this patent is extended or adjusted under 35 U.S.C. 154(b) by 0 days.

(21) Appl. No.: 17/560,180

(22) Filed: Dec. 22, 2021

(51) Int. Cl.
| | |
|---|---|
| *G01R 31/3185* | (2006.01) |
| *G01R 31/317* | (2006.01) |
| *G01R 31/319* | (2006.01) |
| *H03K 3/0233* | (2006.01) |
| *H03K 3/037* | (2006.01) |
| *H03K 3/3562* | (2006.01) |

(52) U.S. Cl.
CPC ........... *G01R 31/318583* (2013.01); *G01R 31/31723* (2013.01); *G01R 31/31924* (2013.01); *G01R 31/318541* (2013.01); *G01R 31/318572* (2013.01); *H03K 3/02332* (2013.01); *H03K 3/0372* (2013.01); *H03K 3/35625* (2013.01)

(58) Field of Classification Search
CPC ...... G01R 31/318583; G01R 31/31723; G01R 31/318541; G01R 31/318572; G01R 31/31924; H03K 3/02332; H03K 3/0372; H03K 3/35625
See application file for complete search history.

(56) References Cited

U.S. PATENT DOCUMENTS

| | | | |
|---|---|---|---|
| 9,473,121 B1 * | 10/2016 | Abhishek | G01R 31/318541 |
| 2007/0279088 A1 * | 12/2007 | Ciccarelli | H03K 19/17736 326/38 |
| 2018/0248541 A1 * | 8/2018 | Purushothaman | H03K 3/35625 |

OTHER PUBLICATIONS

H. Kim, H. Oh, S. Lee and S. Kang, "Low Power Scan Chain Architecture Based on Circuit Topology," 2018 International SoC Design Conference (ISOCC), Daegu, Korea (South), 2018, pp. 267-268. (Year: 2018).*

S. Hatami, M. Alisafaee, E. Atoofian, Z. Navabi and A. Afzali-Kusha, "A low-power scan-path architecture," 2005 IEEE International Symposium on Circuits and Systems, Kobe, Japan, 2005, pp. 5278-5281 vol. 5. (Year: 2005).*

* cited by examiner

*Primary Examiner* — Cynthia Britt
(74) *Attorney, Agent, or Firm* — File-EE-Patents.com; Jay A. Chesavage

(57) ABSTRACT

A scan chain architecture with lowered power consumption comprises a multiplexer selecting between a functional input and a test input. The output of the multiplexer is coupled to a low threshold voltage latch and, in test mode, to a standard threshold voltage latch. The low threshold voltage latch and standard threshold voltage latch are configured to store data when a clock input falls, using a master latch functional clock M_F_CLK, master latch test clock M_T_CLK, slave latch functional clock S_F_CLK, and slave latch test clock S_T_CLK. The slave latch has lower power consumption than the master latch.

15 Claims, 4 Drawing Sheets

Scan Chain – Prior Art

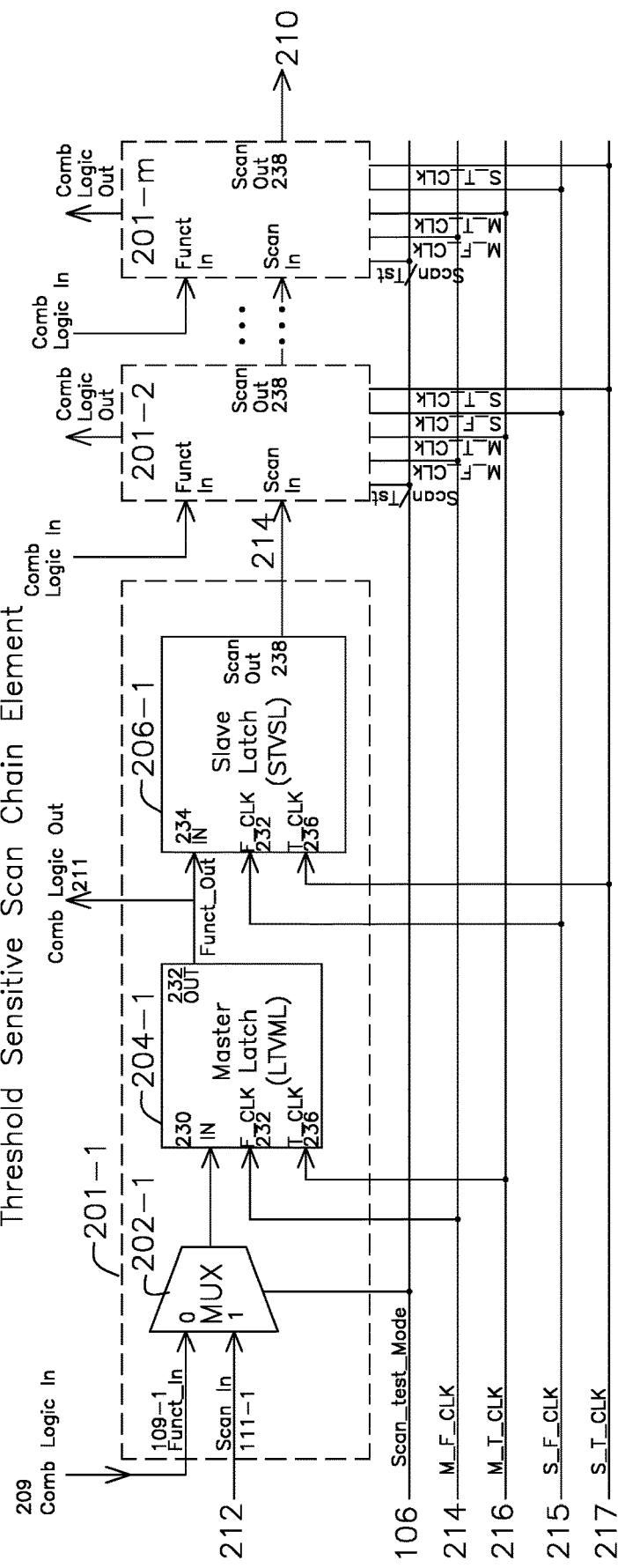

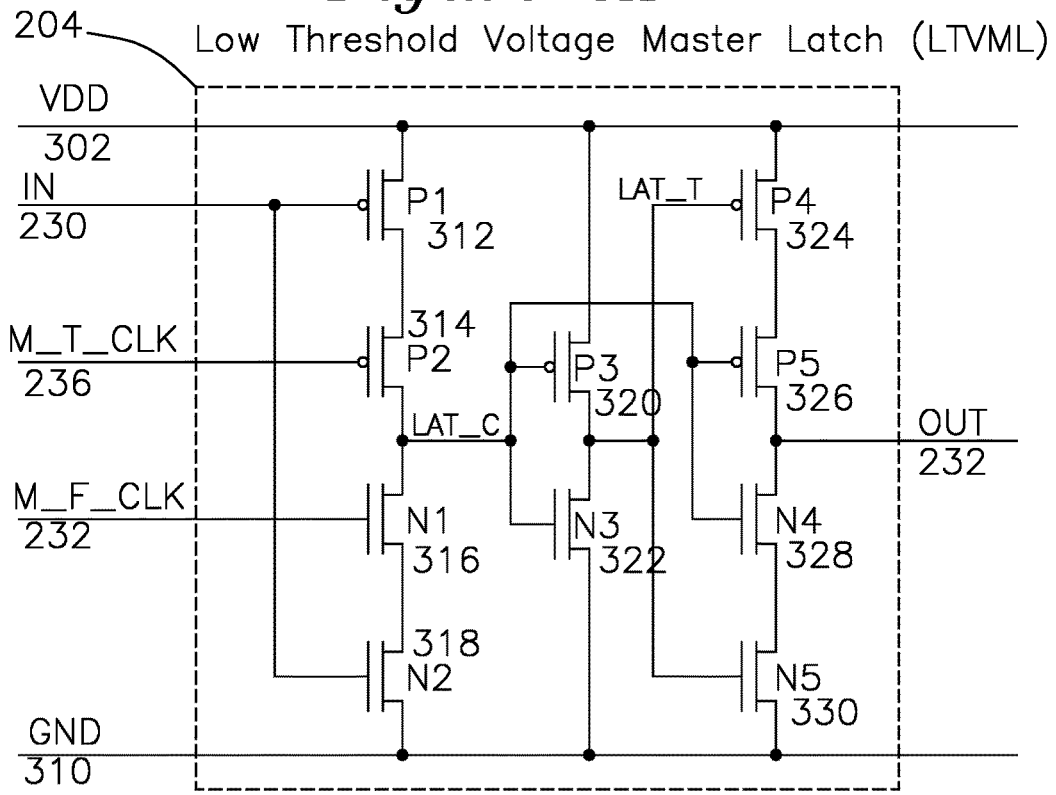
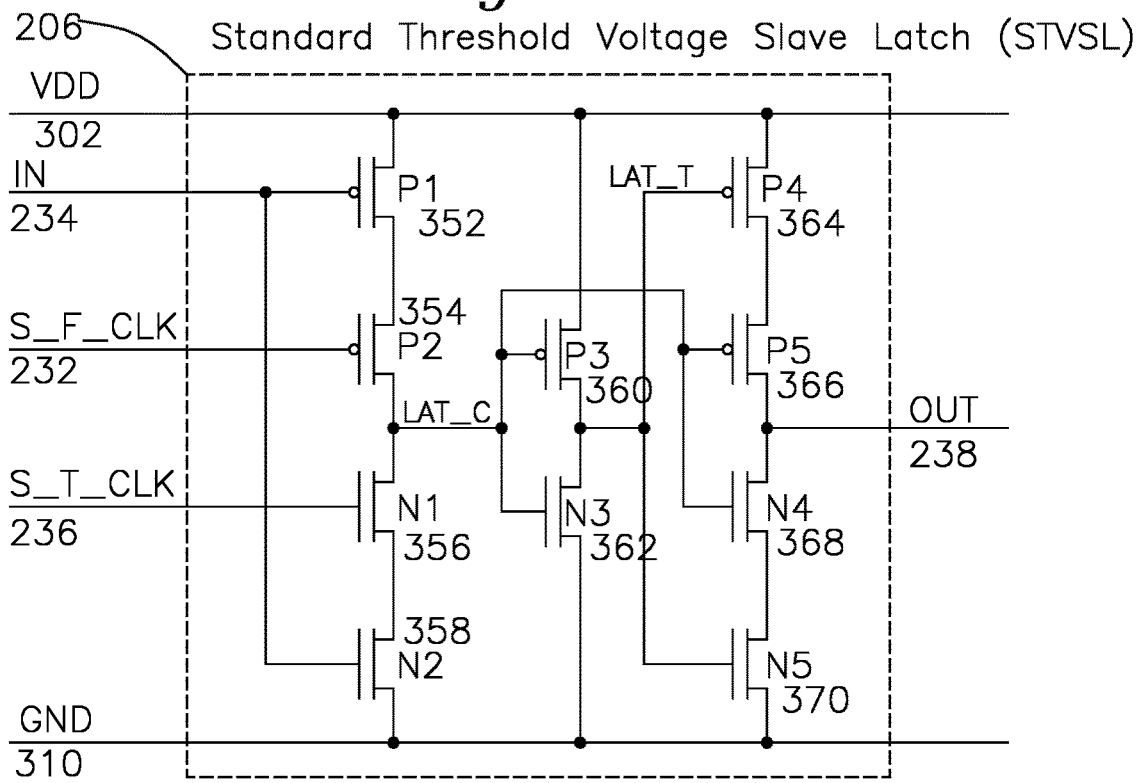

Timing Diagram

SCAN CHAIN FOR MEMORY WITH REDUCED POWER CONSUMPTION

FIELD OF THE INVENTION

The present invention relates to scan chain testing architectures. In particular, the invention relates to testing a series of devices containing memory devices such as flip flops or latches to verify each register element is operating correctly in a test mode of chained devices.

BACKGROUND OF THE INVENTION

Scan-Chain refers to a testing architecture where combinatorial logic has a series of storage elements such as D flip flops (DFF) or latches coupled to combinatorial logic, such that a multiplexer provides for selection between a functional mode and a test mode, where the storage elements are placed in a sequence which allows for all of the storage elements to be tested. Prior art scan chain architectures such as shown in FIG. 1 carry the overhead current consumption of a D flip flop for each stage, and the configuration consumes current whether in a test mode or in a functional mode. It is desired to provide an architecture for a scan chain which reduces the power consumption.

OBJECTS OF THE INVENTION

A first object of the invention is a scan chain element comprising:

a mode selection input Scan_test_mode selecting a functional mode or a test mode;

a multiplexer selecting between a functional logic input when in the functional mode and a test input when in the test mode according to the Scan_test_Mode input;

a master latch comprising low Threshold Voltage (LTVT) transistors forming a low threshold voltage master latch (LTVML) having an input coupled to an output of the multiplexer, the LTVML generating an output coupled to a functional logic output, the master latch clocked by a master functional clock (M_F_CLK) and a master test clock (M_T_CLK) which is inverted from the M_F_CLK, both the M_F_CLK and M_T_CLK running continuously in a functional mode and in a test mode;

a slave latch comprising standard Threshold Voltage (STVT) transistors forming a standard threshold voltage slave latch (STVSL) having an input coupled to the LTVML output and configured to provide a test output for a subsequent scan chain element, the slave latch clocked by a slave functional clock (S_F_CLK) and a slave test clock (S_T_CLK) which is inverted from the S_F_CLK, both the S_F_CLK and S_T_CLK enabled only when in test mode;

where the LTVT transistors have a lower switching threshold voltage than the STVT transistors.

A second object of the invention is a scan chain element comprising:

a mode selection input Scan_test_mode selecting a functional mode or a test mode;

a multiplexer selecting between a functional logic input when in the functional mode and a test input when in the test mode and coupling a selected input to a multiplexer output according to the Scan_test_Mode input;

a master latch comprising low Threshold Voltage transistors (LTVT) forming a low threshold voltage master latch (LTVML) having an input coupled to the output of the multiplexer, the LTVML generating an output coupled to a functional logic output, the master latch clocked by a master functional clock (M_F_CLK) and a master test clock (M_T_CLK) which is inverted from the M_F_CLK, both the M_F_CLK and M_T_CLK running continuously in a functional mode and in a test mode;

a slave latch comprising standard Threshold Voltage (STVT) transistors forming a standard threshold voltage slave latch (STVSL) having an input coupled to the LTVML output and configured to provide a test output for a subsequent scan chain element, the slave latch clocked by a slave functional clock (S_F_CLK) and a slave test clock (S_T_CLK) which is inverted from the S_F_CLK, both the S_F_CLK and S_T_CLK enabled only when in test mode;

the slave latch and master latch each having an input, a T_CLK input, an F_CLK input, and an output, each latch comprising:

VDD power input and a ground reference;

an input transistor series comprising, in sequence: a first P channel transistor (PCT), a second PCT, a first N channel transistor (NCT), and a second NCT;

an inverter transistor series comprising, in sequence: a third PCT and a third NCT;

an output transistor series comprising, in sequence: a fourth PCT, a fifth PCT, a fourth NCT, and a fifth NCT;

a junction of the second PCT and first NCT coupled to gate inputs of the third PCT and third NCT;

a junction of the third PCT and third NCT coupled to gate inputs of the fourth PCT and fifth NCT;

a latch output coupled to a junction of the fifth PCT and fourth NCT;

a gate input of the second PCT coupled to the T_CLK;

a gate input of the first NCT coupled to the F_CLK;

each of the input transistor series, inverter transistor series, and output transistor series coupled between the VDD and the ground reference.

a third object of the invention is a slave latch and master latch, each having an input, a T_CLK input, an F_CLK input, and an output, each latch comprising:

VDD power input and a ground reference;

an input transistor series comprising, in sequence: a first P channel transistor (PCT), a second PCT, a first N channel transistor (NCT), and a second NCT;

an inverter transistor series comprising, in sequence: a third PCT and a third NCT;

an output transistor series comprising, in sequence: a fourth PCT, a fifth PCT, a fourth NCT, and a fifth NCT;

a junction of the second PCT and first NCT coupled to gate inputs of the third PCT and third NCT;

a junction of the third PCT and third NCT coupled to gate inputs of the fourth PCT and fifth NCT;

a latch output coupled to a junction of the fifth PCT and fourth NCT;

a gate input of the second PCT coupled to the T_CLK;

a gate input of the first NCT coupled to the F_CLK;

each of the input transistor series, inverter transistor series, and output transistor series coupled between the VDD and the ground reference;

the PCT and NCT of the slave latch having a higher input switching voltage than the PCT and NCT of the master latch.

SUMMARY OF THE INVENTION

A system has a plurality of storage elements, and the storage elements are configured to be tested as sequentially connected elements known as a scan chain. Each scan chain element has a functional mode and a scan test mode. In a functional mode, input signals from a functional logic path are passed through a multiplexer in the functional mode to a master latch operating with low threshold voltage transistors such as field effect transistors (FET) configured as N channel FETs and P channel FETs, and the output of the master latch is routed back to the functional logic path, typically comprising combinatorial logic. In the scan test mode, the multiplexer receives a scan test input on an different multiplexer input than the functional logic path, the multiplexer selecting a scan test input and passing the scan test input to the master latch which is implemented using low threshold voltage transistors (LTVT), the output of the low threshold voltage master latch (LTVML) provided to the input of a standard threshold voltage slave latch (STVSL), and the output of the standard threshold voltage slave latch (STVSL) is directed to subsequent scan chain elements. The low threshold voltage master latch (LTVML) is clocked by a functional clock (M_F_CLK) and test clock (M_T_CLK) which is inverted 180 degrees from the M_F_CLK, and the slave latch is clocked by a functional clock (S_F_CLK) and a test clock (S_T_CLK) which is inverted (180 degrees out of phase) compared to the S_F_CLK. The M_F_CLK and M_T_CLK run continuously in both test mode and functional mode, and the S_F_CLK and S_T_CLK only runs in test mode. The configuration of the latches and architecture of the scan chain separated into two functional latch constructions provides reduced power consumption with no change in functionality.

BRIEF DESCRIPTION OF THE DRAWINGS

FIG. 2 shows an example of the invention as a sequence of scan chain elements.

FIG. 3A shows a schematic diagram of an example master latch with low threshold voltage FETs.

FIG. 3B shows a schematic diagram of an example slave latch with low threshold voltage FETs.

DETAILED DESCRIPTION OF THE INVENTION

In the present description and figures, like reference numbers refer to the same structures or signals in different views. A value which is "approximately" a nominal value is understood to be in the range of 25% of the nominal value to 150% of the nominal value, and where a constraint such as "low threshold voltage" and "standard threshold voltage" are used in conjunction with "approximately" a percentage of VDD, are understood to be respective voltages which maintain the low threshold voltage below the standard voltage threshold as a constraint within the 25% to 150% range value.

In the present description, logic signals are asserted (or active) as 1, and not asserted (or not active) as 0. The voltage levels for power (or VDD) and inputs are with respect to ground (GND or 0V), and logic levels for 1 may vary according to process, and example values are given for illustration only. For example, "Standard Threshold Logic", may use transistors and fabrication processes where VDD may be 0.75 VDC and a "1" logic input threshold above approximately 50% of VDD and 0 logic level below that voltage. "Low Threshold Voltage Logic" will use transistors with smaller dimension which operate using the same VDD but with lower logic input threshold voltages, such as approximately 33% of VDD, compared to the approximately 50% required by the standard logic. The LTVML will have a lower input switching threshold for I/O than the STVSL for a given process, temperature, or VDD condition, where VDD is typically 0.75 VDC or other value.

Figure 1:
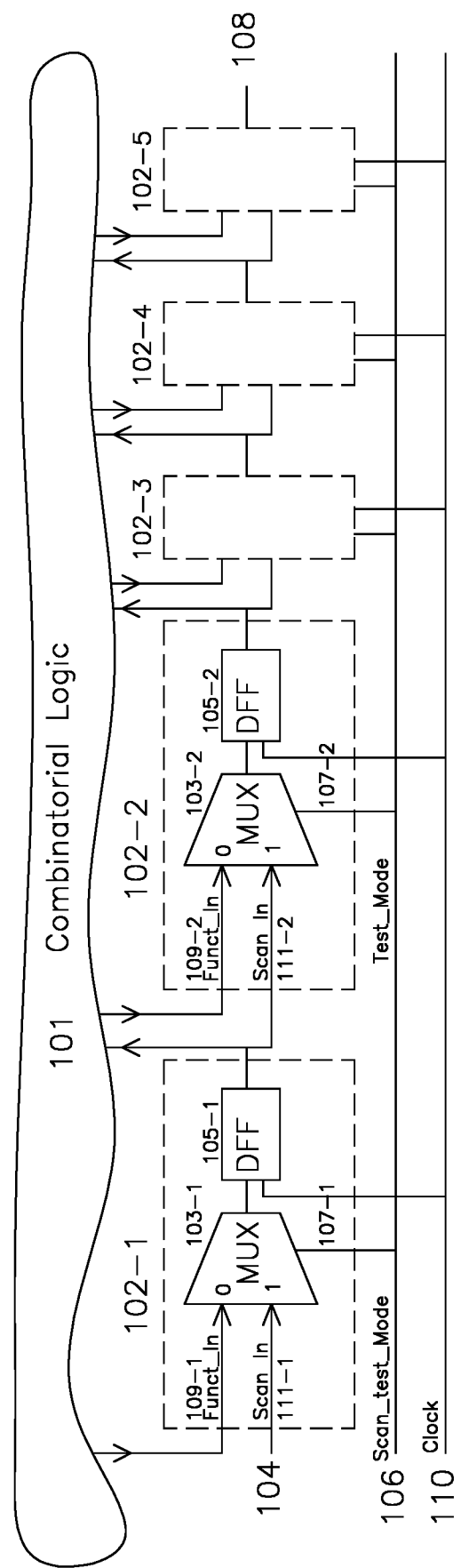
FIG. 1 shows a prior art system with a functional mode and a scan chain test mode.

FIG. 1 shows a prior art system with a functional path and a scan chain path. Functional signals are part of the combinatorial logic 101 shown without specificity and typically comprise various combinatorial logic combinations of AND, NAND, OR, NOR, and XOR gates as are well known in the art of digital logic. A clock input 110 is connected to the clock lines of each DFF 105-1, 105-2, etc., and may run at one frequency for scan test and another frequency in a functional mode. Scan_test_Mode 106 is shown as 0 in a functional mode and 1 in the test mode. When Scan_test_Mode is 0, mux 103-1 selects the Funct_In 109-1 input of mux 103-1, which is coupled into the input of D flip flop (DFF) 105-1 and output to combinatorial logic 101. Each scan chain element 102-1, 102-2, etc. are chained together in a sequence, but since the MUX 103-1 input of each selects Functions 109-1 in functional mode, the output of each DFF 105-1 does not propagate to the next stage beyond the unselected MUX 103-1 input 111-1. In test mode (Scan_test_Mode 106=1), the Scan_In 104 couples through each MUX 103-1, DFF 105-1, and is output to the next stage 102-2, and through each subsequent scan chain element to output 108. By comparing the output 108 with a delayed version of the input 104, the entire chain of DFF and Mux on the path may be verified, thereby providing assurance that the functional system using the DFF and MUX will also work correctly.

FIG. 2 shows a series of scan chain elements 201-1, 201-2, . . . 201-m. Each scan chain element 201-1, 201-2, . . . , 201-m receives the scan test mode 106 input for selection between a functional mode for operation, or a scan test mode for testing the chain of storage (latch) elements. Each scan chain element 201-2 to 201-m is identical to 201-1, with multiplexer (MUX) 202-1, master latch 204-1 and slave latch 206-1. In contrast with the DFF storage element of FIG. 1 such as 105-1 which clocks input data to an output on the rising edge of an applied clock, FIG. 2 shows a latch such a 204-1 and 206-1, where the latch differs from the DFF as in a latch, the output of the latch follows the input until the associated clock input is no longer asserted, at which time the last input value before the clock line was not asserted is stored at the latch output.

Table 1 below shows GIO currents through a series connection of a P channel and N channel transistor under various fabrication conditions, known as process characterization corners. The first letter indicates the P channel device and the second letter indicates the N channel device, such that TT indicates a typical P channel and N channel device in series. The other two letter sequences indicate characteristics by process, voltage, and temperature (PVT), where TT (typical-typical) indicates typical performance at the given voltages and temperatures, as was described previously, and the process corners FS (fast-slow), FF (fast-fast), and SS (slow-slow) showing a comparison of GIO current for LTVT and STVT FET leakage current variation in the N channel FET (NFET) device and P channel FET (PFET) device combinations, respectively. The table shows that using the STVT FET transistor process geometries in the slave latch results in reduced power consumption.

TABLE 1

| PVT (Process/Voltage/Temperature) | GIO using LTVT (µA) | GIO using STVT (µA) | percent reduction in current |
|---|---|---|---|
| TT/0.75 V/27° C. | 0.694 µA | 0.569 µA | 18% |
| TT/0.75 V/125° C. | 16.38 µA | 15.5 µA | 5.4% |
| FS/0.75 V/27° C. | 2.56 µA | 2.12 µA | 17% |
| FS/0.75 V/125° C. | 43.42 µA | 41.84 µA | 3.6% |
| FF/0.75 V/27° C. | 3.613 µA | 3 µA | 17% |
| FF/0.75 V/125° C. | 57.3 µA | 55.77 µA | 2.7% |
| SS/0.75 V/27° C. | 0.195 µA | 0.178 µA | 9% |
| SS/0.75 V/125° C. | 4.8 µA | 4.64 µA | 3.3% |
| SF/0.75 V/27° C. | 0.288 µA | 0.259 µA | 10% |
| SF/0.75 V/125° C. | 7.29 µA | 7.2 µA | 1.2% |

Figure 4:
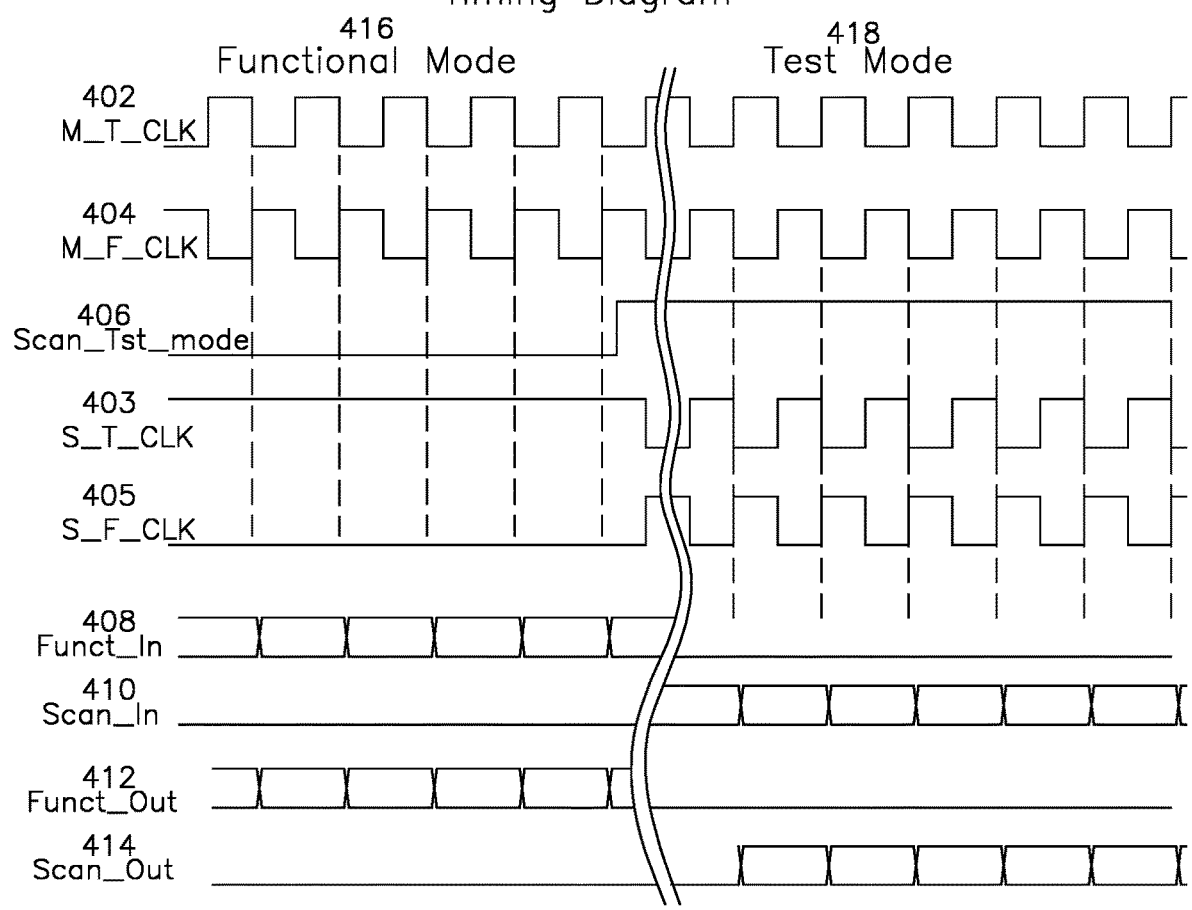
FIG. 4 shows a timing diagram.

In FIG. 2, each associated MUX 202-1 selects functional input 109-1 or Scan_in 111-1 depending on Scan_test_mode 106. When Scan_test_mode=0 (functional mode), functional input signals 109-1 are selected by MUX 202-1, and presented to master latch 204-1, which outputs a latched version 211 to combinatorial logic elements (not shown), with the master latch 204-1 clocked by M_F_CLK 214 and M_T_CLK, which is inverted compared to M_F_CLK 214, and these two clock lines run continuously in both the test mode and in the functional mode. In the test mode with Scan_test_mode 106=1, each MUX 202-1 selects Scan_in 111-1, and outputs the selected signal to Master Latch 204-1 input 230, which receives input 230 and, in response to M_F_CLK and M_T_CLK, outputs to slave latch 206-1. Slave latch 206-1 receives the output 232 from 204-1 and also receives slave test clock (S_T_CLK) and slave master clock (S_M_CLK), which only run in a test mode, thereby further reducing power consumption in the slave latch (in addition to the lower power consumption of STVT transistor geometries in slave latch FIG. 3B compared to LTVT transistor geometries used in master latch FIG. 3A), as the slave latch clocks are only active in test mode. Slave test clock S_T_CLK 236 is inverted compared to slave functional clock (S_F_CLK), and Slave functional clock (S_F_CLK) is inverted compared to master functional clock (M_F_CLK), as shown in FIG. 4. The output of slave latch 206-1 is provided as the output of scan logic element 201-1, and is coupled to each subsequent stage 201-2 . . . 201-m, of the chain, to scan chain output 210.

FIG. 3A shows a schematic diagram of a low threshold voltage master latch (LTVML) built with low threshold voltage FET devices (LTVT of table 1), and FIG. 3B shows a schematic diagram of a standard threshold voltage slave latch (STVSL) with standard threshold voltage FET devices (STVT of table 1). FIG. 3A shows Low threshold voltage P channel FETs 312 (first P channel transistor, P1, or first PCT), 314 (P2 or second PCT), 320 (P3 or third PCT), 324 (P4 or fourth PCT), and 326 (P5 or fifth PCT) and low threshold voltage N channel FETs 316 (first N channel transistor, N1, or first NCT), 318 (N2, second NCT), 322 (N3, third NCT), 328 (N4, fourth NCT), and 330 (N5, fifth NCT). Three series chains of transistors are connected between VDD 302 and ground 310, comprising first series chain with first PCT 312, second PCT 314, first NCT 316 and second NCT 318; second series chain comprising third PCT 320 and third NCT 322; and third series chain comprising fourth PCT 324, fifth PCT 326, fourth NCT 328 and fifth NCT 330, all of which are interconnected as shown in FIG. 3A, with the connection from junction of second PCT and first NCT coupled to gate inputs of: third PCT 320, third NCT 322, fifth PCT 326, and fourth NCT 328; and output taken from the junction of fifth PCT 325 and fourth NCT 328.

FIG. 3B is identically arranged, but using standard threshold voltage N channel FETs 356 (first NCT), 358 (second NCT), 362 (third NCT), 368 (fourth NCT), and 370 (fifth NCT) and standard threshold voltage P Channel FETs 352 (first PCT), 354 (second PCT), 360 (third PCT), 364 (fourth PCT), and 366 (fifth PCT) connected as shown in schematic FIG. 3B and form the Standard threshold voltage Slave Latch (STVSL) of FIG. 3B. Although the schematics shown for FIGS. 3A and 3B are identical, the FET geometry, and logic input voltage switching levels are different, with the FETs of FIG. 3A having lower input switching thresholds compared to the input switching thresholds of FIG. 3A.

In operation, FIG. 3A master latch input 230 (also corresponding to FIG. 2) is an input to be latched, VDD 302 is device power of approximately 0.75 VDC and GND 310 is the reference for the two clock inputs 236 M_T_CLK and M_F_CLK 232. In a functional mode (where Scan_test_Mode 106 of FIG. 2 is not asserted such as logic 0) M_F_CLK 232 (214 of FIG. 2) is inverted compared to M_T_CLK 216, and input 230 receives combinatorial logic input signals from the selected MUX 202-1 input, and master latch 204-1 outputs through 211. In a test mode (where Scan_test_Mode 106 is asserted such as logic 1), M_F_CLK 214 and M_T_CLK 216 also run but M_T_CLK is inverted (or 180 degrees out of phase) compared to M F CLK 214.

FIG. 4 shows an example timing diagram for FIGS. 2, 3A, and 3B. A functional mode interval 416 is shown followed by a test mode interval 418. In the functional mode, Scan_test_Mode 406 is not asserted (0), and M_F_CLK 402 and M_T_CLK run continuously or as needed, typically at a system clock rate for the associated electronic system, with S_T_CLK 403 and S_F_CLK 405 are not active. Combinatorial logic outputs (corresponding to 209 of FIG. 2) are fed as inputs FUNCT_IN 408, generating Funct_Out 412 (corresponding to 211 of FIG. 2) for each scan chain element such as 201-1. Scan_In 410 is not active and Scan Out 406 is not generated in the functional mode.

In a test mode shown as interval 418, M_T_CLK 404 may be generated as before, where an M_F_CLK 402 is an inverted M_T_CLK 403, both of which are active during the test mode, indicated with Scan_test_Mode 406 asserted and Scan_In 410 active, generating Scan Out 414, which propagates the test pattern through each storage element 201-1, 201-2, . . . 201-m to output 210. Typically, in a test mode, a synchronization test pattern is applied to input 212 of FIG. 2, and examined at output 210 to verify it has passed through all of the internal latches of the system.

The present examples are provided for illustrative purposes only, and are not intended to limit the invention to only the embodiments shown.

We claim:

1. A scan chain element comprising:
    a functional logic input and a functional logic output;
    a multiplexer selecting between the functional logic output and a test input according to a Scan_test_Mode input, the multiplexer coupling a selection to a mux output;
    a low threshold voltage master latch (LTVML) having an input coupled to the mux output, the LTVML generating an output coupled to the functional logic input;

a standard threshold voltage slave latch (STVSL) having an input coupled to the LTVML output and configured to provide a test output for a subsequent scan chain element;

a master functional clock (M_F_CLK) input and master test clock (M_T_CLK) input coupled to the LTVML, the LTVML latching the mux output when the M_T_CLK is 1 and the M_F_CLK is 0;

a slave functional clock (S_F_CLK) input and a slave test clock (S_T_CLK) input coupled to the STVSL, the STVSL latching the LTVML output when the S_T_CLK is 1 and the S_F_CLK is 0;

where the S_T_CLK and S_F_CLK are not active when the multiplexer selects the functional logic output, and the S_T_CLK is 180 degrees out of phase from the S_F_CLK when the Scan_test_Mode input asserts a test mode.

2. The scan chain element of claim where the multiplexer selects the functional logic output or the test input according to the Scan_test_Mode input to the multiplexer.

3. The scan chain element of claim 1 where the LTVML generates an output substantially equal to the input when the M_F_CLK is asserted and the STVSL generates an output substantially equal to the input when the S_T_CLK is asserted.

4. The scan chain element of claim 1 where the S_T_CLK and the S_F_CLK are not active in the functional mode.

5. The scan chain element of claim 1 where the M_T_CLK, the M_F_CLK, the S_T_CLK, and the S_F_CLK are all active during the test mode.

6. The scan chain element of claim 1 where the STVSL has an input switching threshold voltage which is greater than an input switching threshold voltage for the LTVML.

7. The scan chain element of claim 1 where the STVSL latch has an input switching threshold which is greater than an input switching threshold for the LTVML.

8. A scan chain element comprising:
a mode selection input Scan_test_mode selecting a functional mode or a test mode;
a multiplexer selecting between a functional logic input when in the functional mode and a test input when in the test mode according to the Scan_test_Mode input;
a master latch comprising low Threshold Voltage transistors (LTVT) forming a low threshold voltage master latch (LTVML) having an input coupled to an output of the multiplexer, the LTVML generating an output coupled to a functional logic output, the master latch clocked by a master functional clock (M_F_CLK) and a master latch test clock (M_T_CLK) which is inverted from the M_F_CLK, both the M_F_CLK and M_T_CLK running continuously in a functional mode and in a test mode;
a slave latch comprising standard Threshold Voltage transistors (STVT) forming a standard threshold voltage slave latch (STVSL) having an input coupled to the output of the LTVML and configured to provide a test output for a subsequent scan chain element, the slave latch clocked by a slave latch functional clock (S_F_CLK) and a slave test clock (S_T_CLK) which is inverted from the S_F_CLK, both the S_F_CLK and S_T_CLK enabled only when in test mode;
where the LTVT transistors have a lower switching threshold voltage than the STVT transistors.

9. The scan chain element of claim where the M_F_CLK is inverted compared to S_F_CLK when the Scan_test_mode input selects a test mode.

10. The scan chain element of claim where the master latch and the slave latch generate an output that follows an input until an associated master latch clock or slave latch clock is not asserted.

11. A scan chain element comprising:
a mode selection input Scan_test_mode selecting a functional mode or a test mode;
a multiplexer selecting between a functional logic input when in the functional mode and a test input when in the test mode according to the Scan_test_Mode input;
a master latch comprising low Threshold Voltage (LTVT) transistors (LTVT) forming a low threshold voltage master latch (LTVML) having an input coupled to an output of the multiplexer, the LTVML generating an output coupled to a functional logic output, the master latch clocked by a master functional clock (M_F_CLK) and a master test clock (M_T_CLK) which is inverted from the M_F_CLK, both the M_F_CLK and M_T_CLK running continuously in a functional mode and in a test mode;
a slave latch comprising standard Threshold Voltage transistors (STVT) forming a standard threshold voltage slave latch (STVSL) having an input coupled to the LTVML output and configured to provide a test output for a subsequent scan chain element, the slave latch clocked by a slave functional clock (S_F_CLK) and a slave test clock (S_T_CLK) which is inverted from the S_F_CLK, both the S_F_CLK and S_T_CLK enabled only when in test mode;
the slave latch and master latch each having an input, a S_T_CLK input, an S_F_CLK input, and an output, each latch comprising:
VDD power input and a ground reference;
an input transistor series comprising, in sequence: a first P channel transistor (PCT), a second PCT, a first N channel transistor (NCT), and a second NCT;
an inverter transistor series comprising, in sequence: a third PCT and a third NCT;
an output transistor series comprising, in sequence: a fourth PCT, a fifth PCT, a fourth NCT, and a fifth NCT;
a junction of the second PCT and first NCT coupled to gate inputs of the third PCT and third NCT;
a junction of the third PCT and third NCT coupled to gate inputs of the fourth PCT and fifth NCT;
a latch output coupled to a junction of the fifth PCT and fourth NCT;
a gate input of the second PCT coupled to the T_CLK;
a gate input of the first NCT coupled to the F_CLK;
each of the input transistor series, inverter transistor series, and output transistor series coupled between the VDD and the ground reference.

12. The scan chain element of claim 11 where the slave latch consumes less current than the master latch.

13. The scan chain element of claim 11 where the VDD is approximately 0.75V.

14. A latch having an input, a test clock (T_CLK) input, a functional clock (F_CLK) input, and an output, the latch comprising:
a VDD power input and a ground reference;
an input transistor series comprising, in sequence: a first P channel transistor (PCT), a second PCT, a first N channel transistor (NCT), and a second NCT;
an inverter transistor series comprising, in sequence: a third PCT and a third NCT;
an output transistor series comprising, in sequence: a fourth PCT, a fifth PCT, a fourth NCT, and a fifth NCT;

a junction of the second PCT and first NCT coupled to gate inputs of the third PCT and third NCT;

a junction of the third PCT and third NCT coupled to gate inputs of the fourth PCT and fifth NCT;

the latch output coupled to a junction of the fifth PCT and fourth NCT;

a gate input of the second PCT coupled to the T_CLK;

a gate input of the first NCT coupled to the F_CLK;

each of the input transistor series, inverter transistor series, and output transistor series coupled between the VDD and the ground reference.

15. The latch of claim 14 where the VDD is approximately 0.75V.

* * * * *